United States Patent [19]
Falque et al.

[11] Patent Number: 6,146,908
[45] Date of Patent: *Nov. 14, 2000

[54] METHOD OF MANUFACTURING A TEST CIRCUIT ON A SILICON WAFER

[75] Inventors: Thierry Falque, Seyssins; Anne Laffont, Fontaine; Philippe Planelle, La Tronche; Dominique Goubier, Grenoble, all of France

[73] Assignee: STMicroelectronics, S.A., France

[*] Notice: This patent issued on a continued prosecution application filed under 37 CFR 1.53(d), and is subject to the twenty year patent term provisions of 35 U.S.C. 154(a)(2).

[21] Appl. No.: 09/420,259

[22] Filed: Oct. 18, 1999

[30] Foreign Application Priority Data

Mar. 12, 1999 [FR] France .................................. 99 03269

[51] Int. Cl.⁷ ............................. H01L 21/00; G01R 31/26
[52] U.S. Cl. ................................................ 438/11; 438/18
[58] Field of Search ...................... 438/11, 18, FOR 142

[56] References Cited

U.S. PATENT DOCUMENTS 4,538,105  8/1985  Ausschnitt et al. .
5,264,377  11/1993  Chesire et al. .
5,705,299  1/1998  Tew et al. ................................. 430/5

FOREIGN PATENT DOCUMENTS 0 602 634 A1   6/1994   European Pat. Off. .......... G03F 7/20

*Primary Examiner*—David E. Graybill
*Attorney, Agent, or Firm*—Felsman, Bradley, Vaden, Gunter & Dillon, LLP

[57] ABSTRACT

The invention relates to a method of manufacturing, on a silicon wafer, a plurality of integrated circuits and at least one test circuit, comprising steps of insulation of the silicon wafer by means of a reticle disposed in an exposure chamber provided with a diaphragm which allows to hide the non useful parts of the reticle. According to the invention, the method comprises an insulation (exposure) step performed by means of a reticle (130) comprising an insulation mask region (132) for integrated circuits together with at least one insulation mask region (133, 134, 135) for a test circuit. The insulation step includes one or more insulation steps during which the insulation mask region for test circuit is hidden by the diaphragm, and at least one insulation step during which the insulation mask region for test circuit is uncovered by the diaphragm, while all or part of the insulation mask for integrated circuit is hidden by the diaphragm.

19 Claims, 8 Drawing Sheets

METHOD OF MANUFACTURING A TEST CIRCUIT ON A SILICON WAFER

BACKGROUND OF THE INVENTION

1. Technical Field

The present invention relates to a method of manufacturing a test circuit on a silicon wafer.

The present invention relates more particularly to the manufacture of a calibration circuit enabling the calibration of a RF integrated circuit probe.

The present invention also relates to the electrical testing of RF integrated circuits.

2. Description of the Related Art

RF integrated circuits include inputs/outputs provided for receiving or emitting electrical signals with a frequency on the order of some hundreds of megaHertz to some gigaHertz and belonging to the range of radio frequencies. Examples include, in particular, integrated circuits comprising analog functions of modulation and demodulation, mixers, amplifiers, filters, voltage controlled oscillators (VCOs), phase locked loops (PLLs), etc., for use in radio receivers, television receivers, mobile radiotelephones, GPS receivers, and the like. Also, some microprocessor digital integrated circuits today reach operating frequencies of about 500–800 MHz, which are included in the range of radio frequencies.

Generally, RF or non-RF integrated circuits are collectively manufactured on a silicon plate called a wafer and are electrically tested by means of a testing probe before cutting the wafer into separate components. This testing step "on wafer" enables location and elimination of faulty integrated circuits before their mounting in a housing or on an interconnection support.

The electrical test of RF integrated circuits requires taking a particular care because, in this frequency range, electrical signals have short wavelengths and various reflection and phase rotation phenomena are seen in the test probes, corrupting the electrical measures by creating interference and changing electrical levels.

Thus, specialized firms have developed RF test probes presenting satisfactory high frequency characteristics. In particular, the firm Cascade™ Microtech, Oregon 96505, USA, provides RF probe tips ("transmission line probes") with the reference "Air Coplanar" and membrane probes ("RFIC membrane probe cards") provided with microstrip HF conductors and nickel contact bumps. Such probes present a bandwidth of several tenths of GigaHertz, a low reflection coefficient S11 and a transmission coefficient S21 with an attenuation lower than 3 dB.

Furthermore, manufacturers of measurement devices such as the firm Teradyne™ have developed test stations (series A580) comprising RF measurement ports provided with a network analyzer ("vector network analyzer") able to determine the "S" parameters (S11, S12/S21, and S22) of a test probe by means of the OSL ("Open, Short, Load") method. As is well known to those skilled in the art, the OSL method consists in performing three measures by successively applying at least three standard loads at the output of a test probe, i.e. a load with an infinite impedance, a load with a zero impedance, and a load with a non-zero impedance, generally of 50Ω. From these three measures, the network analyzer determines the "S" parameters of the probe. Once the "S" parameters are known, the test station performs an automatic error correction during later measures, compensating for the influence of these parameters and obtaining accurate and reliable measures.

At the present time, the standard loads used for carrying out the OSL method are thin layer circuits on ceramic plates, calibrated by a national laboratory of metrology. There can be found therefore on the market calibration circuits comprising various elementary standard structures, like open circuits, short-circuits, and ohmic loads of 50Ω.

Such calibration circuits have several drawbacks, and in particular a high cost and a low lifetime. At each calibration, the tips or contact bumps of the probes to be calibrated are applied with strength on the contact pads of the calibration circuits, so as to break a superficial oxide layer which is formed at the contact of air and provide a good electrical contact ("cold welding").

Furthermore, thin layer calibration circuits do not present the same thickness as silicon wafers and require an adjustment of the test plate for their installation, necessarily followed by another adjustment when installing the wafer. This drawback is added to the fact that RF probes require several calibrations during the test of a set of integrated circuits. These various calibrations involve the intervention of a specialized engineer and represent 5% to 10% of the time dedicated to the electrical test.

The present invention thus recognizes that thin layer calibration circuits do not allow the implementation of a "on line" test method, that is on the production place itself, which gives satisfactory test results and is adapted to mass production which can represent several millions of RF integrated circuits.

Thus, an object of the present invention is to provide a calibration circuit with a low manufacturing cost which allows the calibration of a test probe in a simple manner.

Another object of the present invention is to provide a method allowing the fabrication of a calibration circuit together with integrated circuits to be marketed on a silicon wafer.

SUMMARY OF THE INVENTION

These objects are achieved by providing a method of manufacturing, on a silicon wafer, a plurality of integrated circuits and at least one test circuit, comprising steps of insulation of the silicon wafer by means of a reticle disposed in an exposure chamber provided with a diaphragm which allows masking of the non-useful parts of the reticle, wherein at least one insulation step is performed by means of a reticle comprising an insulation mask for integrated circuits together with at least one insulation mask for a test circuit, the insulation mask for test circuit being disposed so as to be able to be hidden by the diaphragm without hiding the insulation mask for integrated circuits.

According to the invention, the insulation step comprises at least one insulation step of a first region of the silicon wafer, during which the insulation mask for test circuit is hidden by the diaphragm, and at least one insulation step of a second region of the silicon wafer, during which the insulation mask for test circuit is uncovered by the diaphragm.

According to one embodiment, the insulation mask for integrated circuits comprises a plurality of elementary masks arranged in rows and columns, each elementary mask corresponding to an integrated circuit to be made.

According to one embodiment, all or a part of the insulation mask for integrated circuits is hidden by the diaphragm during the insulation step of the second region.

According to one embodiment, the insulation mask for test circuit comprises several elementary masks, each elementary mask being associated to a test circuit to be made.

The present invention also relates to a silicon wafer provided according to the above mentioned method, comprising integrated circuits to be marketed and test circuits grouped together on one or several regions of the wafer. According to one embodiment, the integrated circuits are RF integrated circuits and the test circuits comprise calibration circuits comprising standard loads for calibrating a test probe provided for the electrical test of said RF integrated circuits. Preferably, the calibration circuits comprise contact pads corresponding, due to their position, to RF bonding pads of the integrated circuits.

Advantageously, the calibration circuits comprise each at least one elementary standard structure comprising two contact pads deposited on an electrically insulating layer, at least one standard load which is measurable from the contact pads, and a conductive screen buried under the insulating layer, capable to be connected to a contact pad.

The above as well as additional objectives, features, and advantages of the present invention will become apparent in the following detailed written description.

BRIEF DESCRIPTION OF THE DRAWINGS

These objects, characteristics and advantages of the present invention, as well as others, will be exposed in greater detail in the following description of calibration circuits according to the invention, and a method of manufacturing these calibration circuits, in conjunction with the accompanying drawings, in which.

DETAILED DESCRIPTION OF THE INVENTION

Figure 1:
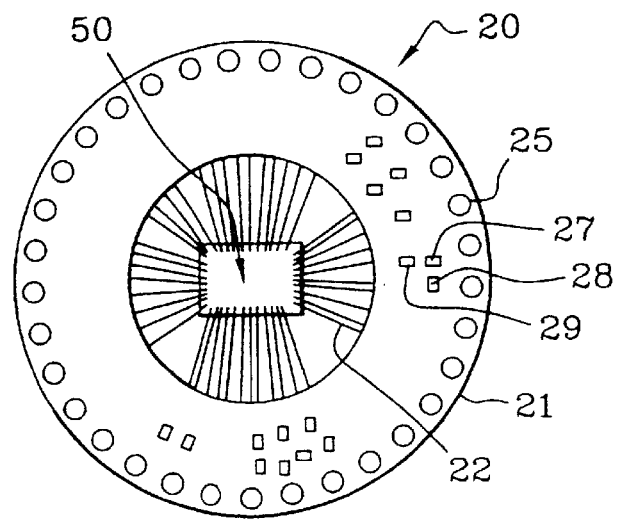
FIGS. 1 and 2 represent respectively a top view and cross-sectional view of a probe for RF integrated circuit.
Figure 2:
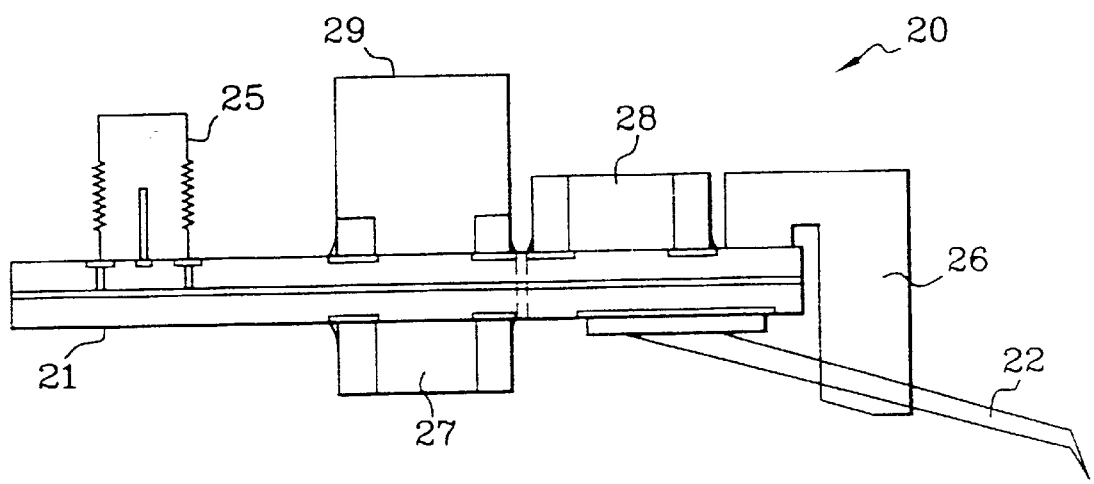

FIGS. 1 and 2 represent very schematically a top view and a cross-sectional view of a probe 20 provided for the electrical test of a RF integrated circuit 50. The probe 20 comprises a multilayer printed circuit 21 provided with metallic pins 22 and connection elements 25. The printed circuit has the form of a ring and pins 22, directed towards the center of the structure, are disposed so as to coincide with the connecting pads of the integrated circuit 50. The pins 22 have their base welded on the printed circuit 21 and are maintained by means of a member 26 forming a kind of crown extending under the printed circuit 21. Furthermore, the printed circuit 21 comprises capacitors 27 and inductances 28 enabling the impedance adjustment of the transmission lines of the probe 20, which couple the connection elements 25 to the pins 22. The printed circuit 21 also comprises transformers 29, in order to deliver symmetrical signals enabling the testing of the differential inputs of the integrated circuit 50.

Figure 3:
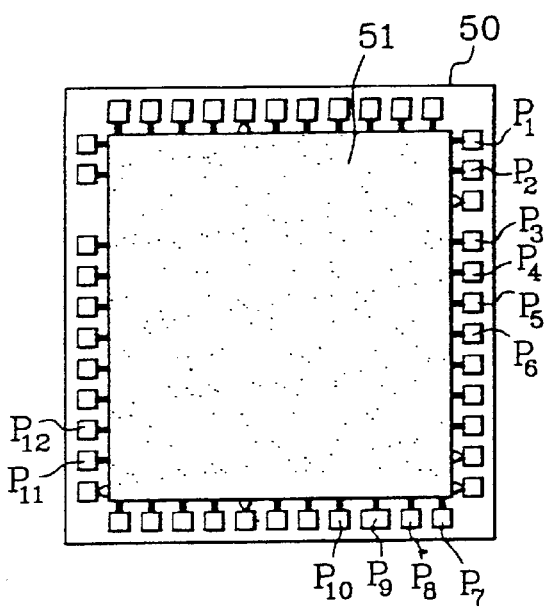
FIG. 3 represents an RF integrated circuit.

As can be seen in FIG. 3, the integrated circuit 50 presents an active zone 51 and metallized bonding pads, among which are present pads of the RF type referenced $P_1$, $P_2$, $P_3$, ..., $P_{12}$ and non-RF pads, without reference. A greater enlargement of the active zone 51 would show hundreds or even thousands of integrated components forming together various electronic functions to be tested. The bonding pads $P_1$ to $P_{12}$ correspond to RF inputs/outputs of the active zone 51. These inputs/outputs can be of the unipolar type (single ended) or the differential type (balanced). The non-RF bonding pads correspond to low frequency inputs/outputs (logical signals) or to DC current inputs/outputs (bias voltages, supply voltages, etc.).

In practice, the characteristics of the RF transmission lines of the probe 20 are measured as "S" parameters by means of the OSL method ("Open", "Short", "Load") and are compensated by common correction techniques during the electrical test of the integrated circuit 50. The "S" parameters are determined by means of a network analyzer, after three measures requiring the successive connection of the pins 22 of the probe 20 to at least three standard loads 21, 22, 23. In the prior art, these standard loads are provided in the form of thin layer calibration circuits on a ceramic substrate, whose drawbacks have been described above.

Figure 4:
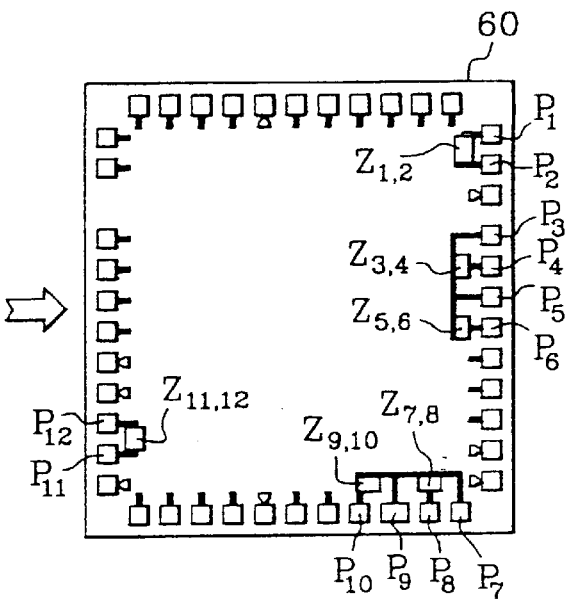
FIG. 4 represents a calibration circuit according to the invention.

FIG. 4 represents a calibration circuit 60 according to the invention. The calibration circuit 60 is implemented on a silicon substrate and forms a kind of dummy integrated circuit 50, which does not comprise the active zone 51. The calibration circuit 60 comprises contact pads $P_1$, $P_2$, ..., $P_{12}$, which correspond to the RF pads with the same reference numbers of the integrated circuit 50. Although not necessary, the non-RF pads of the circuit 50 are also reproduced in the example shown. The pads $P_1$ to $P_{12}$ are two by two connected to an elementary standard load, $Z_{1,2}$, $Z_{3,4}$, $Z_{5,6}$, $Z_{7,8}$, $Z_{9,10}$, $Z_{11,12}$, respectively. The non-RF pads are not connected. Each pair of pads $P_1/P_2$, $P_3/P_4$, ..., $P_{11}/P_{12}$ thus forms, with the standard load Z associated therewith, an elementary standard structure, exemplary embodiments of which will be described in greater detail below.

Figure 5:
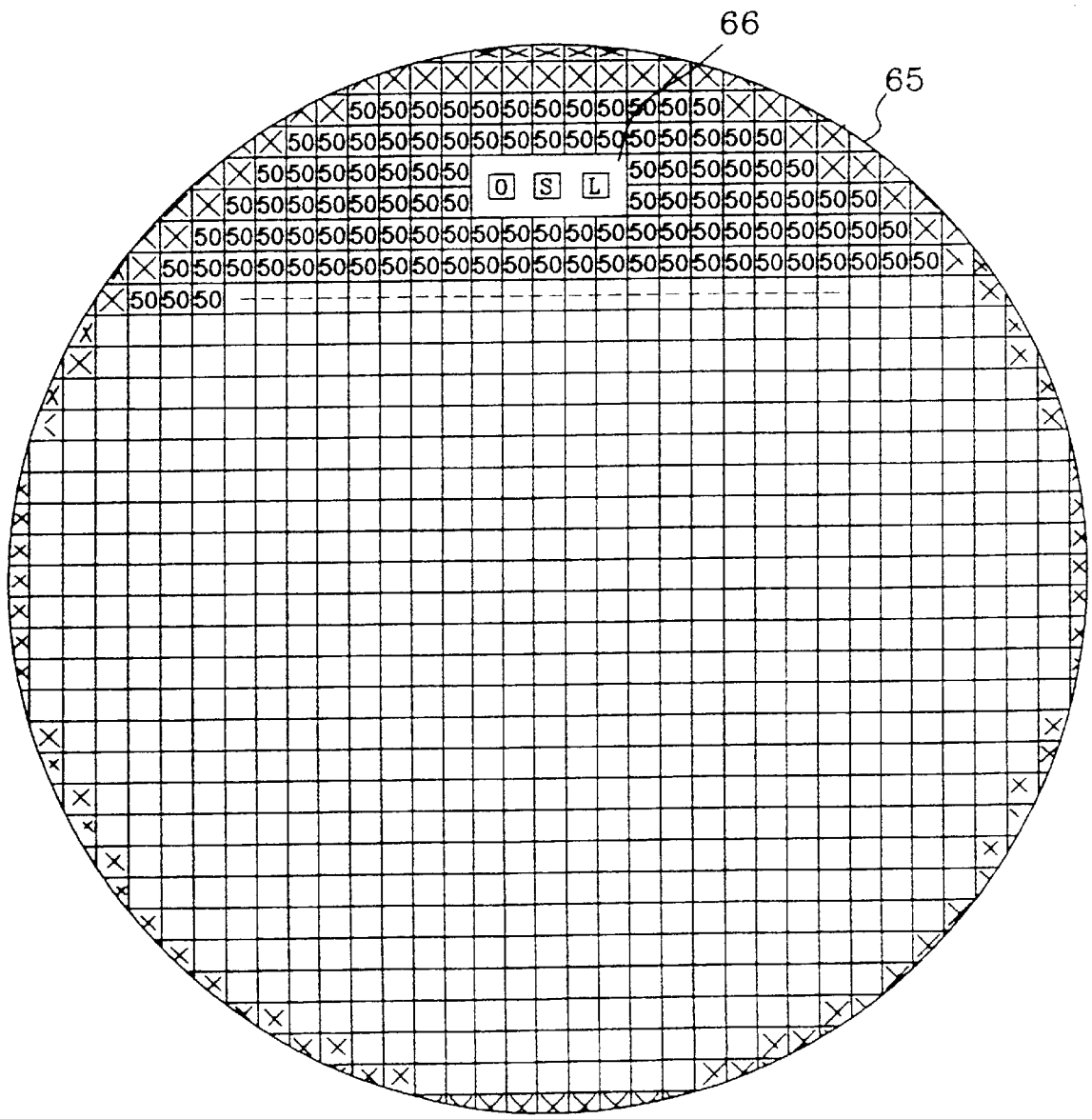
FIG. 5 represents a silicon wafer according to the invention.

As illustrated in FIG. 5, at least three calibration circuits 60 are implemented according to the invention on a silicon wafer 65 of the "product" type—that is, comprising integrated circuits 50 to be marketed. The calibration circuits 60 are disposed in place of some integrated circuits 50. In the example shown, the wafer 65 comprises a row of three calibration circuits 60 of the type "O", "S", "L", occupying a region 66, which, in the prior art, would be occupied by ten integrated circuits 50. The three calibration circuits are differentiated by different standard loads Z. The calibration circuit of the "O" type ("Open") comprises RF pads which are not connected, the loads Z being impedances which are assumed to be infinite. The calibration circuit of the "S" type ("Short-circuit") comprises RF pads which are two by two short-circuited, and the calibration circuit of the "L" type ("Load") comprises RF pads which are two by two connected to a resistor R.

Optionally, the region 66 may also comprise calibration circuits of the "C1" and "C2" type (not shown), in which the loads Z are capacities or inductances. These additional calibration circuits allow the verification of the calibration results obtained by means of the "O", "S", "L" calibration circuits.

Thus, there are provided calibration circuits 60 with the same form and the same size as the integrated circuits 50 to be tested, disposed on the "product" wafer 65 itself, the calibration circuits having contact pads which coincide with the pins of the test probe 20. Using the calibration circuits 60, it is possible to calibrate the RF transmission lines of the probe 20 in a simple way with a limited number of manipulations. It is no longer necessary to remove the wafer from the test plate (chuck) in order to put ceramic calibration circuits thereon.

Figure 6:
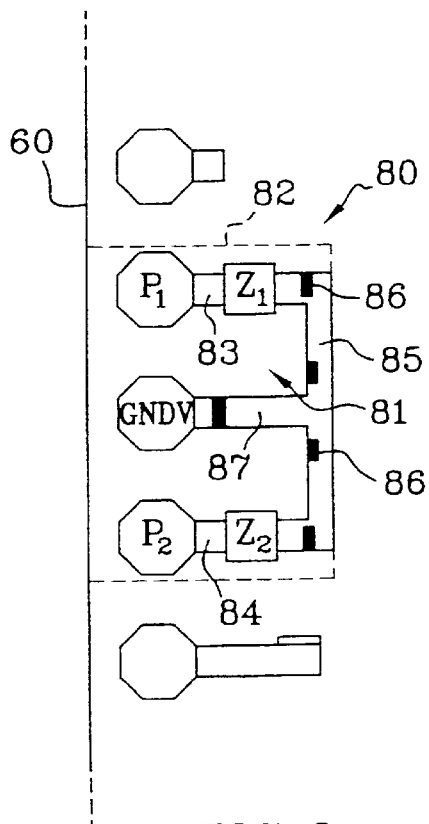
FIGS. 6, 7 and 8 represent top views of three standard structures according to the invention.

FIG. 6 represents an elementary standard structure 80 of a calibration circuit 60 according to the invention. The standard structure 80, here of the symmetrical type, is suitable for calibrating a symmetrical transmission line of the probe 20 (FIGS. 1 and 2). It comprises two contact pads $P_1$ and $P_2$, deposited on an insulating layer 81, for example of silicon oxide, and a conductive screen 82 buried under the oxide layer and whose periphery is indicated by a dotted line. The conductive screen 82, of metal, highly doped silicon or polycrystalline silicon, confines the electrical field which is radiated with a high frequency by the contacts $P_1$ and $P_2$, and limits the electrical losses between the structure 80 and the substrate (wafer). The pads $P_1$ and $P_2$ are each connected to a load $Z_1$ or $Z_2$ by means of sections of conductive tracks 83 or 84. The other ends of the loads $Z_1$ and $Z_2$ are connected to a track section 85, which is in turn connected to the screen 82 by means of metallized vertical connections 86 passing through the oxide layer 81. Furthermore, the track section 85 presents in its central part an extension in the form of an arm 87 leading to a virtual ground pad GNDV, disposed between the pads $P_1$ and $P_2$. This pad GNDV is provided to allow the calibration of the standard structure 80 by means of non symmetrical RF probe tips, for example the "Air Coplanar" tips marketed by the firm Cascade™ Microtech. In this case, the elementary load $Z_1$ between the pads $P_1$ and GNDV, and the elementary load $Z_2$ between the pads $P_2$ and GNDV are measured, giving the standard impedance (Z1+Z2) of the structure 80. The result is stored in a memory or on a disk and is provided to a network analyzer when calibrating the probe 20.

The loads $Z_1$ and $Z_2$ are schematically represented in the form of a square block. In practice, this block can be let empty ("Open") or receive a metallic strip, for example of aluminum. Depending on the form given to the metallic strip, a short-circuit ("Short") or a resistor ("Load") is provided. Thus, the elementary standard structure 80 can be of the "O", "S" or "L" type.

Figure 7:
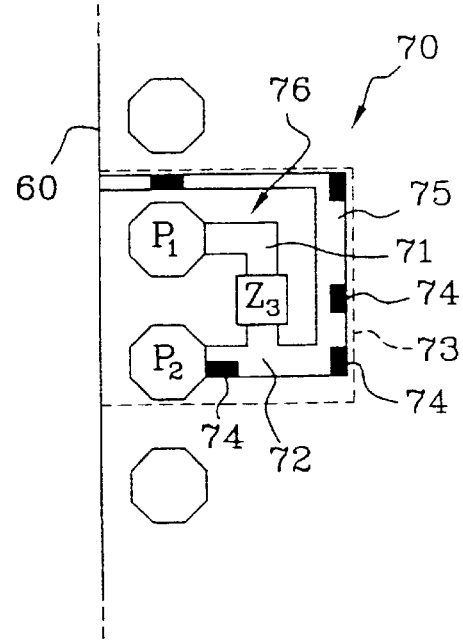

FIG. 7 represents an elementary standard structure 70 of the non symmetrical type, comprising contact pads $P_1$ and $P_2$ for receiving the phase and the ground of a measure signal, respectively. The pad $P_1$ is coupled to a load $Z_3$ by means of a track section 71. The pad $P_2$ is coupled to the other end of the load $Z_3$ by means of a track section 72, which is connected to a conductive screen 73 buried under an oxide layer 76. The track section 72 presents an extension in the form of an arm 75 extending along the area occupied by the screen 73, and comprises various metallized vertical connections 74 ensuring a good connection with the screen 73.

Figure 8:
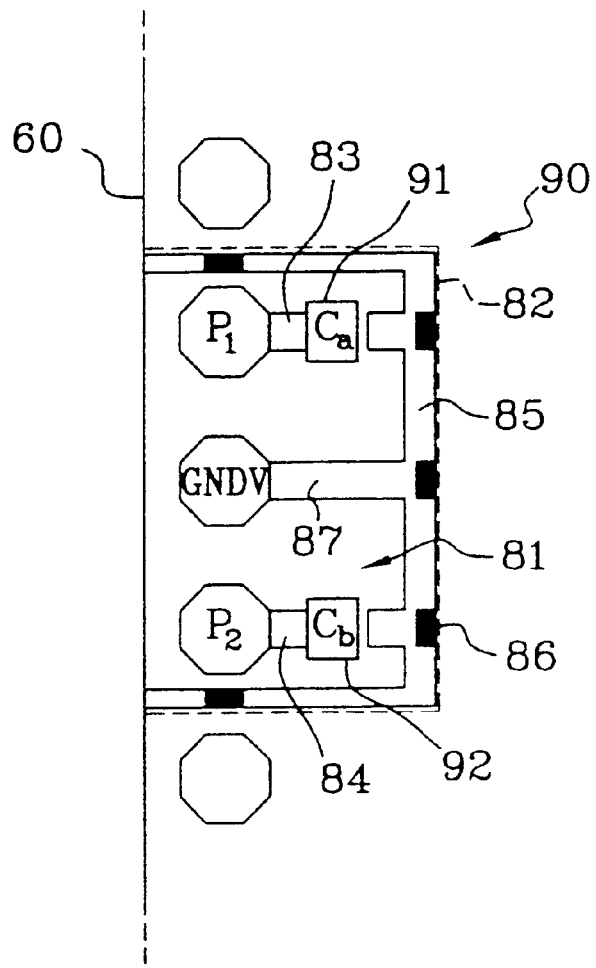
Figure 9:
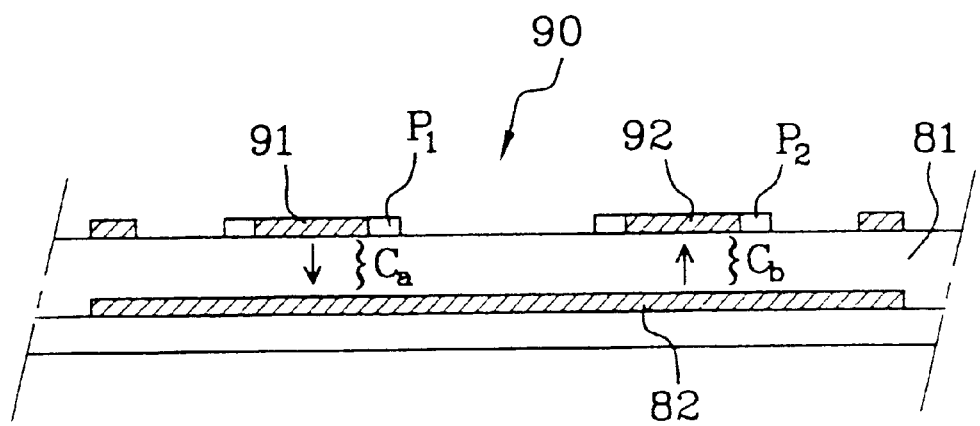
FIG. 9 is a cross-sectional view of the standard structure of FIG. 8.

Lastly, FIGS. 8 and 9 represent a top view and a cross-sectional view of an elementary standard structure 90 of the "C1" or "C2" type, looking a lot like the structure 80 of FIG. 6, from which the references of the common elements have been maintained. Here, the elementary charges are formed by conductive plates 91, 92, connected to the pads $P_1$ and $P_2$, but which are not in contact with the central track section 85. Thus, as it appears in FIG. 9, the plates 91 and 92 form, with the buried conductive screen 82, two capacitors $C_a$ and $C_b$ arranged in series. The overall impedance of the structure 90 is a capacitor with a value equal to "C1" or "C2", depending on the size of the plates 91 and 92.

Various alternative embodiments of these standard structures can be imagined by those skilled in the art from the examples described here-above. Furthermore, although not shown in FIG. 4 for the sake of simplicity, it follows from the foregoing that the calibration circuit 60 may include one or more virtual ground pads GNDV. If the distance between the contact pads $P_1$ to $P_{12}$ does not allow the insertion of the GNDV pad, this pad is disposed to the right of the standard loads, within the circuit 60. As an alternative, a pad $GNDV_1$ may be arranged facing the pad $P_1$ and a pad $GNDV_2$ may be arranged facing the pad $P_2$.

A method of implementing calibration circuits 60 at a specific place 66 of the wafer 65, as shown in FIG. 5, will now be described. In the following, the technological aspects relating to the manufacture of calibration circuits will not be described in detail. The integrated circuits 50 being collectively manufactured according to standard methods comprising various etching steps, for which those skilled in the art will readily use some etching steps of integrated circuits elements to make simultaneously the elements of the calibration circuits 60. These steps are for example the final manufacturing steps of integrated circuits, which conventionally comprise, in the CMOS process:

1) depositing a metallic layer called "metal 1" on the wafer;
2) etching the "metal 1" layer, enabling the design of a first level of conductive tracks;
3) depositing a silicon oxide layer on the wafer;
4) etching the oxide layer (creation of openings);
5) a step of depositing a metallic layer called "metal 2", enabling the design of a second conductive level and the filling of the interconnection openings (vertical connections);
6) etching the "metal 2" layer, enabling the design of a second level of conductive tracks;
7) depositing a silicon oxide layer on the wafer;
8) etching the oxide layer (creation of openings);
9) depositing a metallic layer called "metal 3"; and
10) etching the "metal 3" layer, providing the bonding pads, the ground surfaces and the supply areas of the integrated circuits 50.

Thus, for example, step 6 consisting of etching the "metal 2" layer enables the design of the conductive screens of the elementary structures according to the invention in the region 66 of the wafer 65 (FIG. 5). Step 8 enables the design in the oxide layer of the openings for the vertical connection of the conductive screens. Step 10 etching of the "metal 3" layer enables the simultaneous design of the tracks sections, the impedances Z1 and Z2, and the contact pads of the calibration circuits 60. Of course, if a manufacturing step of the integrated circuits 50 does not correspond to any manufacturing step of the calibration circuits 60, the region 66 is covered with a resin mask during this step.

Various alternatives and combinations of these steps may be imagined by those skilled in the art. Furthermore, other technological processes, such as the HSB2 process ("High Speed Bipolar 2") used for manufacturing some RF integrated circuits, enable the design of the conductive screens from an epitaxial silicon layer highly doped or from a polycrystalline silicon layer, by providing trenches in the layer.

Whatever the technological process may be, these manufacturing steps of integrated circuits and calibration circuits require the providing of resin engraving masks comprising etching patterns for elements of integrated circuits 50 together with etching patterns of elements of calibration circuits 60. However, the conventional insulation methods do not allow the design of such engraving masks in a simple way, as will be understood in relation with FIGS. 10 and 11.

Figure 10:
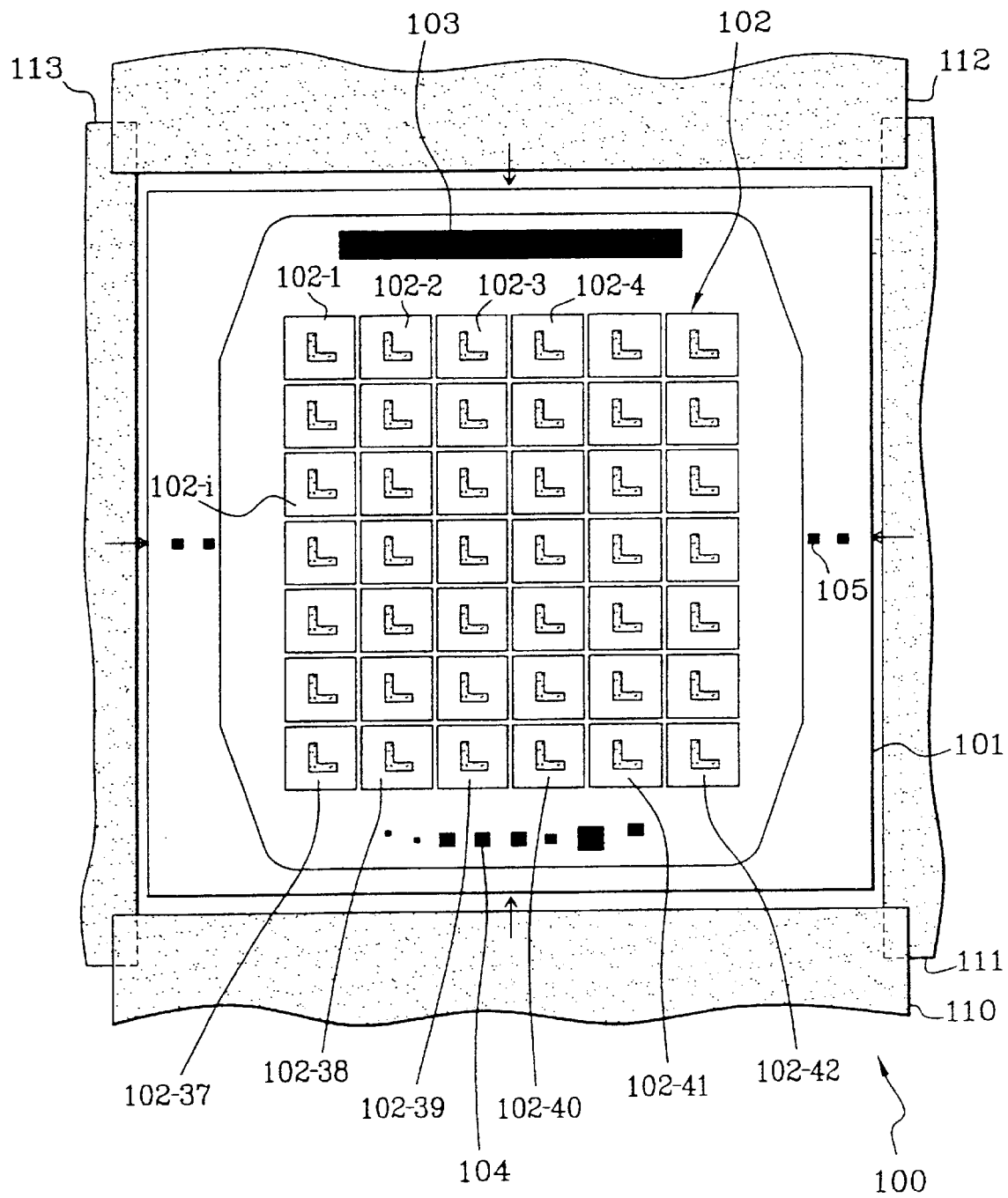
FIG. 10 represents a conventional exposure chamber allowing the providing of an engraving mask.

FIG. 10 very schematically represents an exposure chamber 100 of an insulation system ("stepper") enabling the design of engraving masks. The chamber 100 comprises a reticle 101 and movable metallic blades 110, 111, 112, 113, forming together a diaphragm with parallel edges. The reticle 101 is a glass plate covered with an etched chromic layer forming an insulation mask 102 and various centering patterns 103, 104, 105. The insulation mask 102 comprises a plurality of elementary masks 102-i arranged in rows and columns, each of them corresponding to an integrated circuit. Here, the mask comprises 7 rows and 6 columns of elementary masks—that is, in total forty-two elementary masks 102-1 to 102-42. Each elementary mask 102-i comprises here a pattern in "L" form, which is not at scale and is only given for illustration purposes.

To perform an engraving mask, the wafer is first covered with a layer of photosensitive resin. The diaphragm formed by the blades 110 to 113 is closed in order to let only mask 102 appear. A light is sent into the exposure chamber and the image of mask 102 is projected on the wafer. After the insulation, the resin which has been insolated (positive resin) or the resin which has not been insolated (negative resin) is solved (developed) by a chemical agent in order to let appear etching openings, here with a "L" form.

Figure 11:
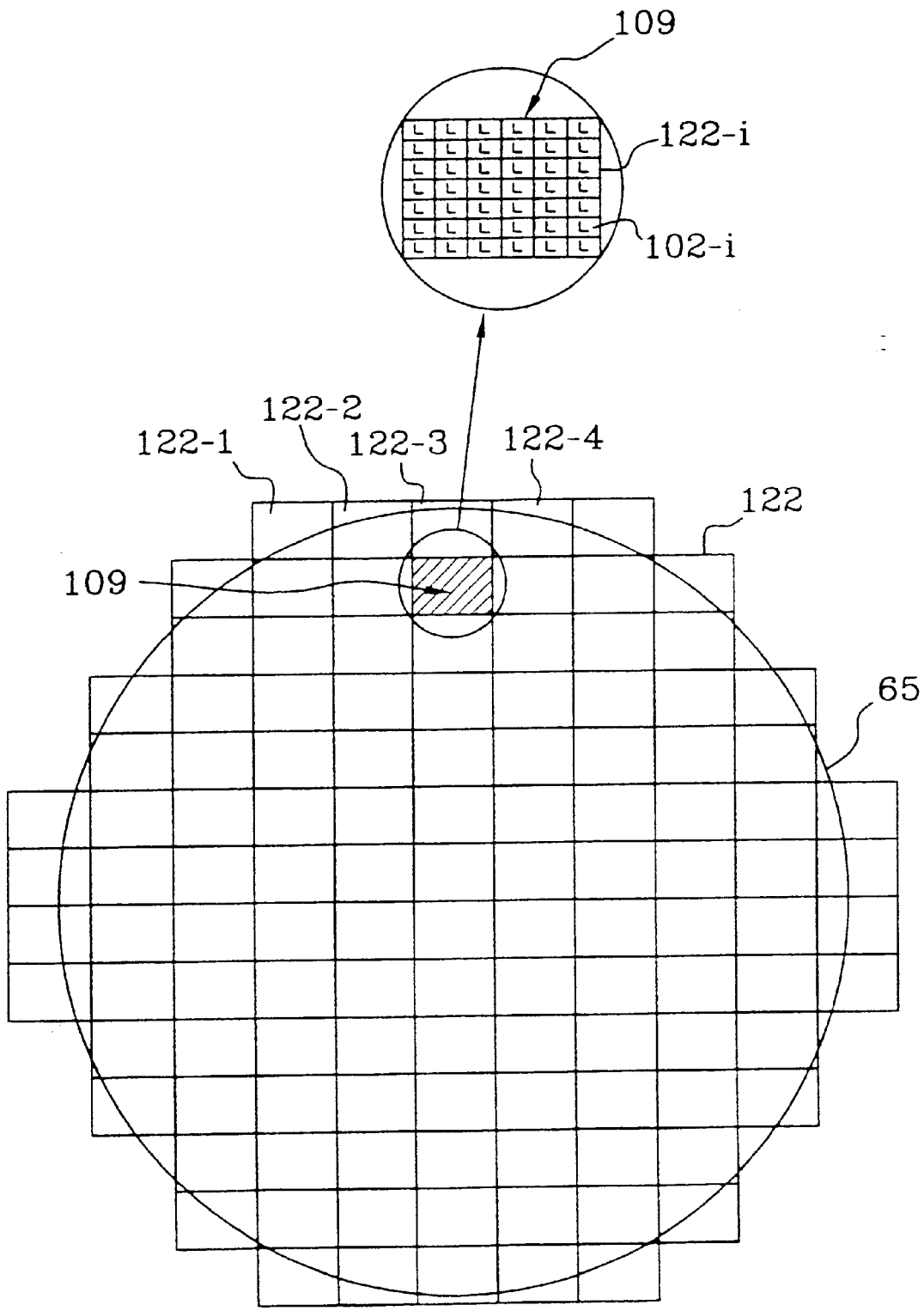
FIG. 11 represents conventional insulation regions on the surface of a silicon wafer.

To aid in better understanding, FIG. 11 represents the image 109 of the mask 102 projected on the surface of the wafer 65. The image 109 occupies a region 122-i, which represents a part only of the whole surface of the wafer 65. The surface of the wafer 65 is segmented into a plurality of insulation regions 122-1, 122-2, 122-3, etc. defining together an insulation grid 122. Thus, N insulation-defining steps are necessary to cover all the regions 122-i of the wafer 65. In the represented example, the wafer 65 is provided for receiving about 3000 integrated circuits and comprises 120 insulation regions 122-i. The design of the complete engraving mask requires thus 120 insulation-defining steps. These steps are performed in an automatic way, the wafer 65 being disposed on a movable plate which is driven by a step-by-step ("stepper") motor. The step-by-step motor and the diaphragm blades are controlled by a computer which has in a memory the parameters of the insulation grid.

Thus, this conventional insulation method enables the design of an engraving mask comprising etching patterns 102-i which repeat in each region 122-i. The problem here is to design an engraving mask comprising, in a specific region, etching patterns of elements of calibration circuits.

In the prior art, it is known to design test circuits together with integrated circuits, by inserting an elementary mask for test circuit in the insulation mask 102 of FIG. 10, in the place of an elementary mask 102-i for integrated circuit. However, this method leads to design on the wafer as many test circuits as insulation regions. This method does not allow the design of calibration circuits 60 isolated on the wafer, as shown in FIG. 5. A conceivable method for this consists in replacing the reticle 101 by a reticle comprising a mask for calibration circuits, at a moment when the region reserved for the calibration circuits has to be exposed. However, the change of reticle during the insulation-defining process requires stopping the motor which drives the wafer and implies delicate operations for centering the new reticle. This solution is not convenient for manufacture at industrial scale, because it is necessary that all the insulation-defining steps of the wafer are performed continuously and without manual intervention.

To solve this problem, the present invention provides a reticle comprising elementary insulation masks for integrated circuits together with elementary insulation masks for calibration circuits, disposed so that the masks for calibration circuits can be hidden by means of the diaphragm blades 111 to 114 without hiding the masks for integrated circuits.

Figure 12:
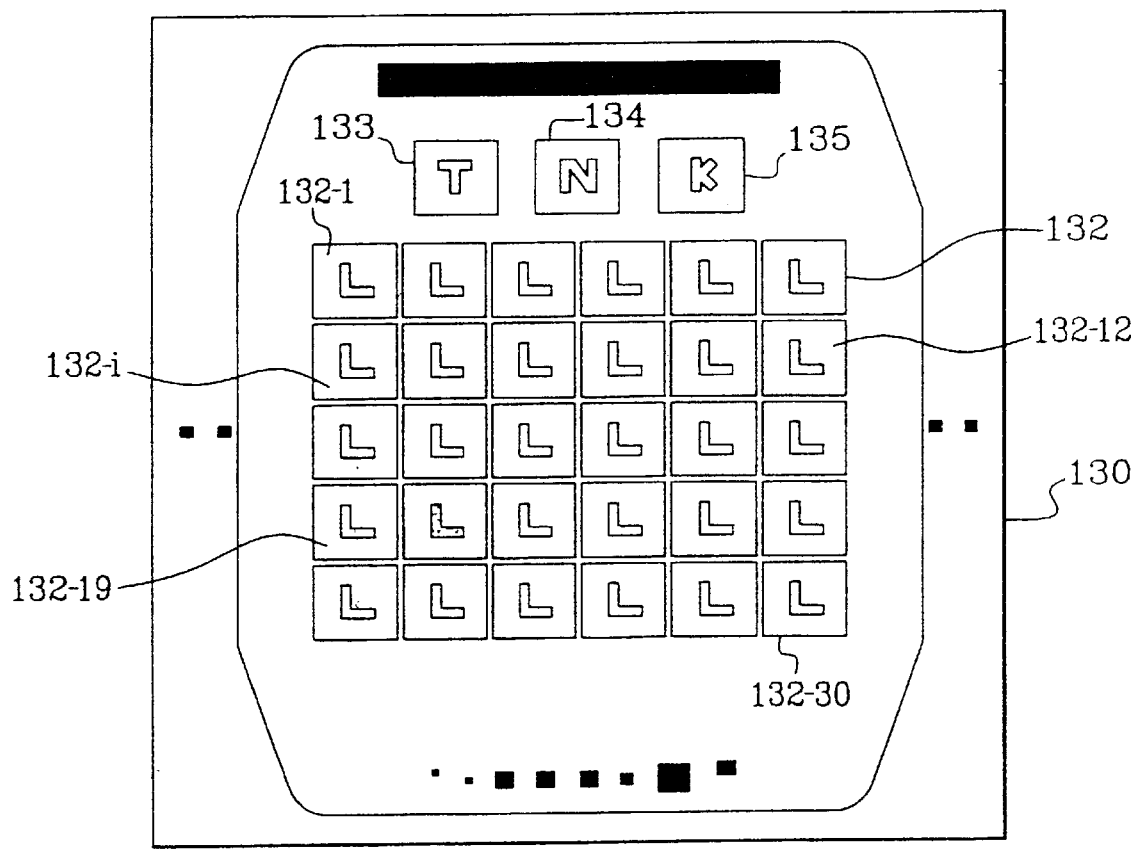
FIG. 12 represents an exposure chamber comprising a reticle according to the invention.

By way of example, FIG. 12 represents a reticle 130 according to the invention. The reticle 130 comprises an insulation mask 132 for integrated circuits, occupying a central position, and elementary insulation masks 133, 134, 135 corresponding to elements of the three calibration circuits of the "O", "S", "L" type which are wished to be designed. In this example, the mask 132 distinguishes from the mask 102 of FIG. 10 in the fact that it only comprises 5 rows of 6 elementary masks 132-i instead of 7 rows, that is 30 elementary masks 132-1 to 132-30. Thus, the elementary masks 133, 134, 135 are disposed above the mask 132 using the place left by the suppression of the two rows of elementary masks of the initial mask 102. For security reasons, a spacing of about 5 mm is provided between the mask 132 and the row of elementary masks 133, 134, 135. Here, the elementary masks 133, 134, 135 comprise patterns in the form of "T", "N" and "K", respectively. These patterns do not correspond to real patterns, neither by their form nor by their size, and are only given by way of example.

Figure 13:
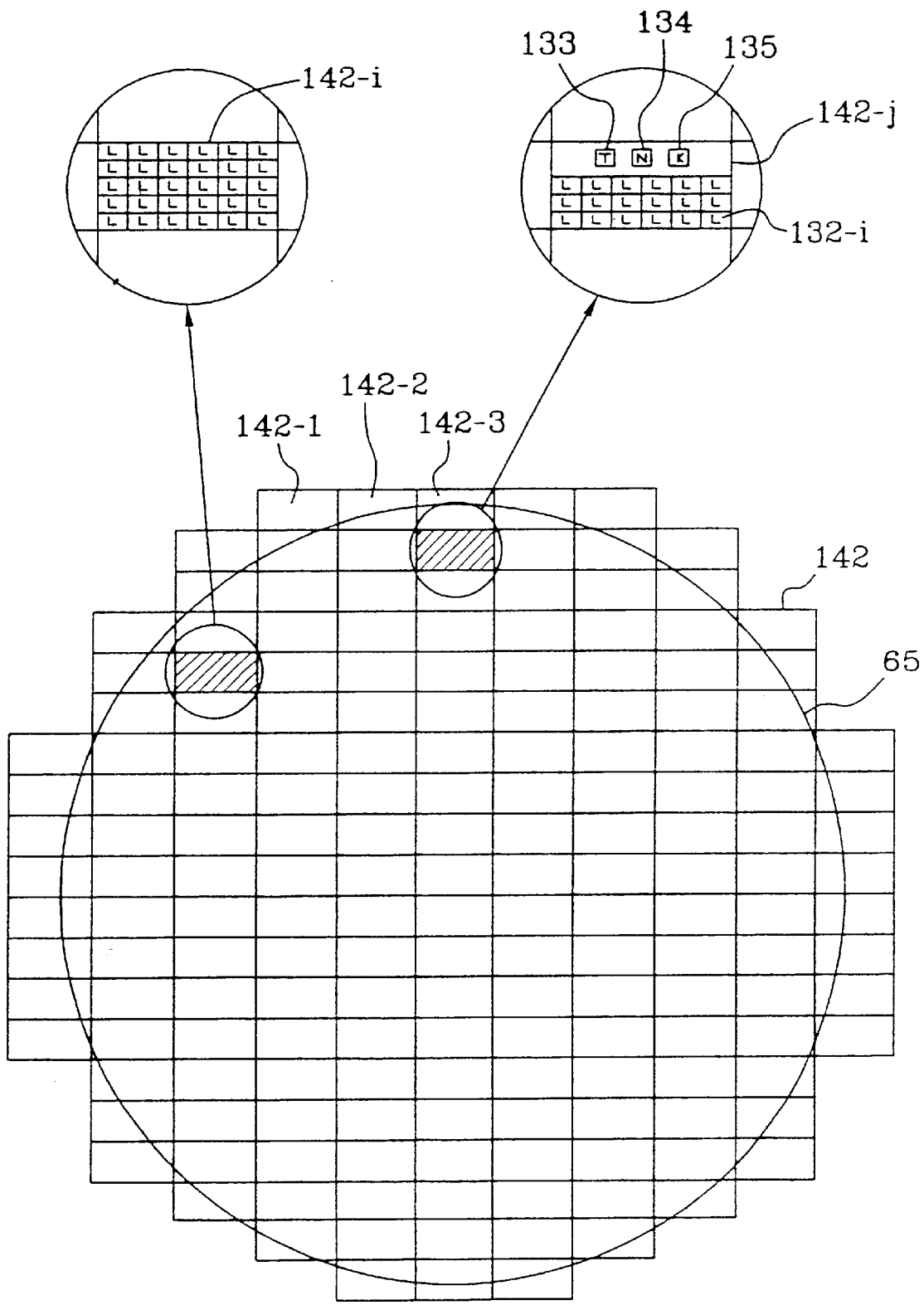
FIG. 13 represents insulation regions of a silicon wafer by means of the reticle of FIG. 12.

FIG. 13 represents an insulation grid 142 for the silicon wafer 65 and illustrates the method of the invention. First, the elementary masks 133, 134 and 135 are hidden by the diaphragm blades and light passes only through the mask 132. All the regions 142-i of the insulation grid 142 are insolated (exposed) on the surface of the wafer 65, except a region 142-j reserved for the calibration circuits. When the exposure chamber is facing the region 142-j, the insulation-defining step is performed in two times. At first, the elementary masks 133, 134 and 135 and the two top rows of the mask 132, comprising the elementary masks 132-1 to 132-12, are hidden by the diaphragm blades (FIG. 10). The light only passes through the bottom part of the mask 132. Subsequently, the position of the reticle 130 and diaphragm blades is modified, so that the elementary masks 133, 134, and 135 are aligned with the top portion of the exposure area, within the region which would otherwise be exposed through the top two rows of the mask 132, and so that only the elementary masks 133, 134 and 135 are uncovered. A dual exposure thus is thus performed, which lets appear the patterns "T", "N" and "K" of the three calibration circuits in the top part of the region 142-j and three rows of six "L"patterns for integrated circuits in the bottom part of the region 142-j.

Of course, the providing of the 18 "L" patterns is optional, as the whole mask 132 can be hidden by the diaphragm blades. Moreover, several regions 142-i of the grid 142 may optionally be exposed by means of the masks 133, 134 and 135. Several sets of calibration circuits are then provided on the wafer.

The method according to the invention is simple to carry out and do not require any manual intervention. The shutting position of the diaphragm blades is programmed for each insulation or exposure region 142-i and do not require any command during the exposure process. Furthermore, the additional exposure time involved by the increase of the number of exposure regions and the decrease of the size of the insulation mask for integrated circuits may be considered as negligible in practice.

By way of example, a conventional reticle has a useful surface of 21 mm×22.8 mm. In order to design integrated circuits with a length of 3.22 mm and a width of 2.87 mm, the maximal number of elementary masks which can be disposed on the reticle is equal to 42 (7 rows and 6 columns). According to the invention, the maximal number of elementary masks for integrated circuits is equal to 30 (5 rows and 6 columns), if there are added three elementary masks for calibration circuits disposed at 5 mm one from the other and at 5 mm from the elementary masks for integrated circuits. The time required for a complete exposure of a photosensitive resin mask is thus increased with about 35% with respect to the prior art. However, 1 hour is commonly necessary to expose the masks of a batch of integrated circuits comprising 25 wafers of 8 inches (200 mm) receiving 3000 integrated circuits each, and a complete manufacturing cycle generally comprises 25 engraving or diffusion masks, that is 25 exposure hours for the batch of integrated circuits, spread over a manufacturing cycle of 45 days (a manufacturing cycle comprising various steps of oxide or metal deposition, etching, ion implantation, removal of resin masks, etc.). With the invention, three or four engraving masks must be modified to incorporate patterns of calibration circuits. The increase of time of 35% for implementing these three or four masks represents only 4% to 5% of the total exposure time, and an increase of 0.05 seconds of the average manufacturing time of an integrated circuit, which is about 50 seconds. Finally, the method according to the invention involves a negligible increase of the manufacturing cost, compared to that which would be involved by a change of reticle during the exposure process.

Furthermore, it will be apparent to those skilled in the art that this method is suitable for designing any kind of test circuit. A test circuit may comprise simple geometrical patterns enabling the checking of the good alignment of the various engraving masks and/or the control of the resolution of the manufacturing process. A test circuit may also comprise electrical or electronic components allowing the verification that the electrical characteristics targeted by the manufacturing process are obtained, and to detect the eventual drifts of the process.

As in the prior art, it remains furthermore possible to provide various types of elementary masks on the same reticle, in order to design integrated circuits which have not the same structure. Also, test circuits may be mixed with the integrated circuits by inserting masks for test circuits among the masks for integrated circuits. Furthermore, in the top or bottom part of the reticle, the masks for calibration circuits may be replaced by masks corresponding to other types of test circuits. Thus, the invention enables the design of all kinds of arrangements and combinations of integrated circuits and test circuits on the surface of a silicon wafer.

While the invention has been particularly shown and described with reference to a preferred embodiment, it will be understood by those skilled in the art that various changes in form and detail may be made therein without departing from the spirit and scope of the invention.

What is claimed is:

1. A method of manufacturing, on a silicon wafer, a plurality of integrated circuits and at least one test circuit, comprising:

insulation of the silicon wafer through a reticle disposed in an exposure chamber and provided with a diaphragm which allows a portion of the reticle to be hidden, wherein at least one insulation step performed through the reticle exposes at least part of an insulation mask portion for integrated circuits together with an insulation mask portion for a test circuit, the insulation mask portion for the test circuit disposed so as to be able to be hidden by the diaphragm without hiding the insulation mask portion for the integrated circuits.

2. The method of claim 1, wherein the insulation step comprises:

at least one insulation step of a first region of the silicon wafer, during which the insulation mask portion for the test circuit is hidden by the diaphragm, and at least one insulation step of a second region of the silicon wafer, during which the insulation mask portion for the test circuit is uncovered by the diaphragm.

3. The method of claim 1, wherein the insulation mask portion for integrated circuits comprises a plurality of elementary masks arranged in rows and columns, each elementary mask corresponding to an integrated circuit.

4. The method of claim 3, wherein all or a part of the insulation mask portion for integrated circuits is hidden by the diaphragm during the insulation of the second region.

5. The method of claim 1, wherein the insulation mask for test circuit comprises several elementary masks, each elementary mask corresponding to a test circuit.

6. A silicon wafer, comprising:

a plurality of regions each corresponding to an exposure region for insulation of the silicon wafer through a reticle, the reticle having an area larger than the exposure region and including a first portion for integrated circuits to be marketed and a second portion for test circuits, wherein a first region of the silicon wafer has a pattern corresponding to insulation through only the first portion of the reticle, and wherein a second region of the silicon wafer has a pattern corresponding to insulation through part of the first portion of the reticle and through the second portion of the reticle.

7. The silicon wafer of claim 6, wherein the integrated circuits are RF integrated circuits, and the test circuits are calibration circuits comprising standard loads for calibrating a test probe provided for electrical testing of the RF integrated circuits (50).

8. The silicon wafer of claim 7, wherein the calibration circuits include contact pads corresponding in position to RF bonding pads of the integrated circuits.

9. The silicon wafer of claim 8, wherein the calibration circuits each include at least one elementary standard structure comprising two contact pads deposited on an electrically insulating layer, at least one standard load, which is measurable from the contact pads, and a conductive screen buried under the insulating layer.

10. The silicon wafer of claim 9, comprising at least one calibration circuit comprising a standard structure wherein the conductive screen is connected to a contact pad.

11. The silicon wafer of claim 9, comprising at least one calibration circuit comprising two standard loads arranged in series connected to the conductive screen by their mid-point.

12. The silicon wafer of claim 11, comprising at least one calibration circuit comprising at least one additional contact pad for having access to the mid-point of the two standard loads.

13. The method of claim 1, wherein the insulation mask portion for the integrated circuits includes a plurality of circuit areas each smaller that an exposure area for the exposure chamber.

14. A method of producing integrated circuits and test structures on a wafer, comprising:

providing a reticle having an area larger than an exposure area employing in exposing regions of the wafer, the reticle including
- a first portion having an area equal to the exposure area and including a plurality of patterns for an integrated circuit, and
- a second portion smaller than the exposure area and including at least one pattern for a test structure;

providing a diaphragm capable of selectively
- masking the second portion of the reticle while exposing only the first portion, or
- masking part of the first portion of the reticle while exposing the second portion;

exposing a plurality of circuit regions on the wafer through the reticle with the diaphragm masking the second portion of the reticle and exposing only the first portion of the reticle to form the plurality of patterns for the integrated circuit on each of the plurality of circuit regions; and exposing at least one test region on the wafer through the reticle with the diaphragm masking part of the first portion of the reticle and exposing the second portion to form the test structure on the at least one test region.

15. The method of claim 14, wherein the step of providing a reticle having an area larger than an exposure area employing in exposing regions of the wafer further comprises:
- forming an integer number of patterns for the integrated circuit in rows on the first portion of the reticle; and
- forming the at least one test structure within an area adjacent to an end row within the first portion and equal in size to one or more rows within the first portion.

16. The method of claim 15, wherein the step of providing a diaphragm capable of selectively masking the second portion of the reticle while exposing only the first portion or masking part of the first portion of the reticle while exposing the second portion further comprises:
- sizing an opening through the diaphragm to equal the exposure area;
- selectively masking either the second portion of the reticle or one or more rows within the first portion of the reticle with the diaphragm by altering a relative position of the opening through the diaphragm with respect to the reticle.

17. The method of claim 16, wherein the step of selectively masking either the second portion of the reticle or one or more rows within the first portion of the reticle with the diaphragm by altering a relative position of the opening through the diaphragm with respect to the reticle further comprises:
- altering a relative position of the opening through the diaphragm with respect to the reticle to mask the second portion of the reticle and expose the entire first portion of the reticle for each of the plurality of circuit regions on the wafer; and
- altering a relative position of the opening through the diaphragm with respect to the reticle to mask one or more rows within the first portion of the reticle and expose remaining rows within the first portion of the reticle and the second portion of the reticle for each of the plurality of test regions on the wafer.

18. The method of claim 16, wherein the step of selectively masking either the second portion of the reticle or one or more rows within the first portion of the reticle with the diaphragm by altering a relative position of the opening through the diaphragm with respect to the reticle further comprises:
- shifting the reticle, the diaphragm, or both.

19. The method of claim 15, wherein the step of forming the at least one test structure within an area adjacent to an end row within the first portion and equal in size to one or more rows further comprises:
- forming three standard test structures within the second portion of the reticle, each standard test structure including contact pads positioned within the second portion of the reticle at a location corresponding to a position of bonding pads within a row of the patterns for the integrated circuit.

* * * * *